(12) United States Patent
Kim et al.

(10) Patent No.: US 10,971,560 B2
(45) Date of Patent: Apr. 6, 2021

(54) DISPLAY DEVICE, APPARATUS AND METHOD FOR TESTING DISPLAY DEVICE

(71) Applicant: SAMSUNG DISPLAY CO., LTD., Yongin-si (KR)

(72) Inventors: Hyo Jung Kim, Yongin-si (KR); June Hwan Kim, Yongin-si (KR); Jong Woo Park, Yongin-si (KR); Dae Guen Choi, Yongin-si (KR); Jae Sik Son, Yongin-si (KR); Young Tae Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 151 days.

(21) Appl. No.: 16/404,021

(22) Filed: May 6, 2019

(65) Prior Publication Data
US 2019/0348478 A1 Nov. 14, 2019

(30) Foreign Application Priority Data

May 8, 2018 (KR) .................. 10-2018-0052341

(51) Int. Cl.
*H01L 27/32* (2006.01)
*H05K 1/18* (2006.01)
*G09G 3/00* (2006.01)

(52) U.S. Cl.
CPC ......... *H01L 27/3223* (2013.01); *G09G 3/006* (2013.01); *H01L 27/3276* (2013.01);
(Continued)

(58) Field of Classification Search
CPC ......... H01L 27/00; H01L 27/28; H01L 27/32; H01L 27/3223; H01L 27/3241;
(Continued)

(56) References Cited

U.S. PATENT DOCUMENTS 8,259,073 B2 * 9/2012 Kim ................. G06F 3/023
345/169
2014/0204285 A1 * 7/2014 Jang ................. G02F 1/13338
349/12

(Continued)

FOREIGN PATENT DOCUMENTS

KR 10-2013-0000528 A 1/2013
KR 10-2013-0073637 A 7/2013

(Continued)

*Primary Examiner* — Hoai-An D. Nguyen
(74) *Attorney, Agent, or Firm* — Kile Park Reed & Houtteman PLLC

(57) ABSTRACT

Disclosed herein are a display device, an apparatus for testing a display device, and a method for testing a display device. A display device includes a first substrate having a display area and a non-display area defined thereon, the non-display area being on an outer side of the display area. The non-display area may include a plurality of test pads and a first dummy thin-film transistor electrically connected to the test pads. The first dummy thin-film transistor includes (Continued)

a dummy gate electrode, and a dummy source electrode and a dummy drain electrode insulated from the gate electrode and spaced apart from each other. A bending area is defined on the first substrate that at least partially traverses the display area and the non-display area, the bending area overlaps the first dummy thin-film transistor.

20 Claims, 11 Drawing Sheets

(52) U.S. Cl.
CPC ..... *H05K 1/189* (2013.01); *G09G 2300/0413* (2013.01); *G09G 2300/0426* (2013.01); *H05K 2201/10128* (2013.01)

(58) Field of Classification Search
CPC . H01L 27/3244; H01L 27/3276; H01L 51/00; H01L 51/0001; H01L 51/0031; H05K 1/00; H05K 1/18; H05K 1/189; H05K 2201/10128; G09G 3/00; G09G 3/006; G09G 2300/00; G09G 2300/04; G09G 2300/0404; G09G 2300/0413; G09G 2300/0421; G09G 2300/0426

USPC ....... 324/500, 512, 527, 528, 529, 530, 531, 324/532, 533, 537, 760.01, 760.02; 345/156, 173

See application file for complete search history.

(56) References Cited

U.S. PATENT DOCUMENTS

| | | | |
|---|---|---|---|
| 2015/0160511 A1* | 6/2015 | Kim | G02F 1/133553 349/43 |
| 2015/0319862 A1* | 11/2015 | Kuriyama | H05K 1/028 349/56 |
| 2016/0179229 A1* | 6/2016 | Ahn | G06F 3/04164 345/173 |
| 2017/0170206 A1* | 6/2017 | Lee | H01L 27/124 |
| 2017/0262109 A1* | 9/2017 | Choi | H01L 51/56 |
| 2018/0083211 A1* | 3/2018 | Lee | H01L 27/3258 |
| 2018/0166525 A1* | 6/2018 | Kim | H01L 51/0031 |
| 2018/0204896 A1* | 7/2018 | Park | H01L 27/3258 |
| 2020/0371627 A1* | 11/2020 | Luo | H01L 27/323 |

FOREIGN PATENT DOCUMENTS

| | | |
|---|---|---|
| KR | 10-2014-0030682 A | 3/2014 |
| KR | 10-1385631 B1 | 4/2014 |

* cited by examiner

DISPLAY DEVICE, APPARATUS AND METHOD FOR TESTING DISPLAY DEVICE

CROSS-REFERENCE TO RELATED APPLICATION

Korean Patent Application No. 10-2018-0052341, filed on May 8, 2018, in the Korean Intellectual Property Office, and entitled: "Display Device, Apparatus and Method for Testing Display Device," is incorporated by reference herein in its entirety.

BACKGROUND

1. Field

The present disclosure relates to a display device, an apparatus for testing a display device, and a method for testing a display device.

2. Description of the Related Art

Some organic light-emitting display devices (OLEDs) are flexible so that they can be folded or bent. When an organic light-emitting display device is folded or bent, some elements therein may be damaged by stress due to the bending. Accordingly, elements in the such display devices should be checked from various viewpoints to make sure they are operating normally.

SUMMARY

According to one or more embodiments, there is provided a display device including a first substrate having a display area and a non-display area defined thereon, the non-display area being on an outer side of the display area; a plurality of test pads disposed in the non-display area; and a first dummy thin-film transistor in the non-display area and electrically connected to the test pads. The first dummy thin-film transistor may include a dummy gate electrode; and a dummy source electrode and a dummy drain electrode insulated from the gate electrode and spaced apart from each other. A bending area may be defined on the first substrate that at least partially traverses the display area and the non-display area, and that overlaps the first dummy thin-film transistor.

The display device may further include a second dummy thin-film transistor disposed adjacent to the first dummy thin-film transistor.

A first reference line passing through the dummy source electrode and the dummy drain electrode may be defined in the first dummy thin-film transistor. Here, a second reference line may be defined in the second dummy thin-film transistor, and the first reference line and the second reference line may extend in different directions.

The first reference line may be perpendicular to the second reference line.

The test pads may include a first test pad, a second test pad, and a third test pad connected to the first dummy thin-film transistor, and a fourth test pad, a fifth test pad, and a sixth test pad connected to the second dummy thin-film transistor.

The first dummy thin-film transistor and the second dummy thin-film transistor may be between the first through third test pads and the fourth through sixth test pads, the first test pad, the second test pad, and the third test pad may be arranged in parallel, and the fourth test pad, the fifth test pad and the sixth test pad may be arranged in parallel.

The display device may further include a third dummy thin-film transistor defining a third reference line; and a fourth dummy thin-film transistor defining a fourth reference line. Here, the first reference line, the second reference line, the third reference line and the fourth reference line may extend in different directions.

The display device may further include a flexible printed circuit board connected to the non-display area of the first substrate. Here, the first dummy thin-film transistor may overlap the flexible printed circuit board.

The display device may further include a dummy semiconductor pattern layer that overlaps the dummy gate electrode, the dummy drain electrode, and the dummy source electrode.

A plurality of pixels may be in the display area. Each of the pixels may include at least one switching element, and the switching element may have a shape substantially the same as a shape of the dummy thin-film transistor.

According to one or more embodiments, there is provided an apparatus for testing a display device. The apparatus may include a test circuit film connected to a first substrate having a display area and a non-display area defined thereon, wherein the non-display area is on an outer side of the display area, and wherein the first substrate includes a first dummy thin-film transistor in the non-display area and a plurality of test pads connected to the first dummy thin-film transistor; connection pads formed on a side of the test circuit film and electrically connected to the test pads, respectively; and a meter connected to the test circuit film. A bending area may be defined that at least partially traverses the display area and the non-display area, the first dummy thin-film transistor may overlap with the bending area, and the meter may check influence on the first dummy thin-film transistor when the bending area is bent.

The meter may provide the first dummy thin-film transistor with a test signal through the connection pads and the test pads, and then may check a response from the dummy thin-film transistor.

The meter may check in real-time the influence on the first dummy thin-film transistor by the bending area.

The first substrate may further include a second dummy thin-film transistor disposed adjacent to the first dummy thin-film transistor.

A first reference line may be defined in the first dummy thin-film transistor, a second reference line may be defined in the second dummy thin-film transistor, and the first reference line and the second reference line may extend in different directions.

According to one or more embodiments, there is provided a method for testing a display device. The method may include preparing a first substrate having a display area and a non-display area defined thereon, wherein the non-display area is on an outer side of the display area, and wherein the first substrate includes a first dummy thin-film transistor and a plurality of test pads connected to the first dummy thin-film transistor; preparing an apparatus for testing a display device, wherein the apparatus includes a test circuit film having a plurality of connection pads thereon and a meter connected to the test circuit film; pressing the test circuit film and the first substrate such that the connection pads are electrically connected to the test pads; forming a bending area on the first substrate such that the bending area overlaps the first dummy thin-film transistor; and providing a test signal to the first dummy thin-film transistor, and checking a response from the first dummy thin-film transistor to the test signal by using the meter.

Forming the bending area may include changing the bending area.

The meter may check in real-time the influence on the first dummy thin-film transistor by the bending area.

The first substrate may further include a second dummy thin film transistor adjacent to the first dummy thin film transistor.

A first reference line may be defined in the first dummy thin-film transistor, a second reference line may be defined in the second dummy thin-film transistor, and the first reference line and the second reference line may extend in different directions.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
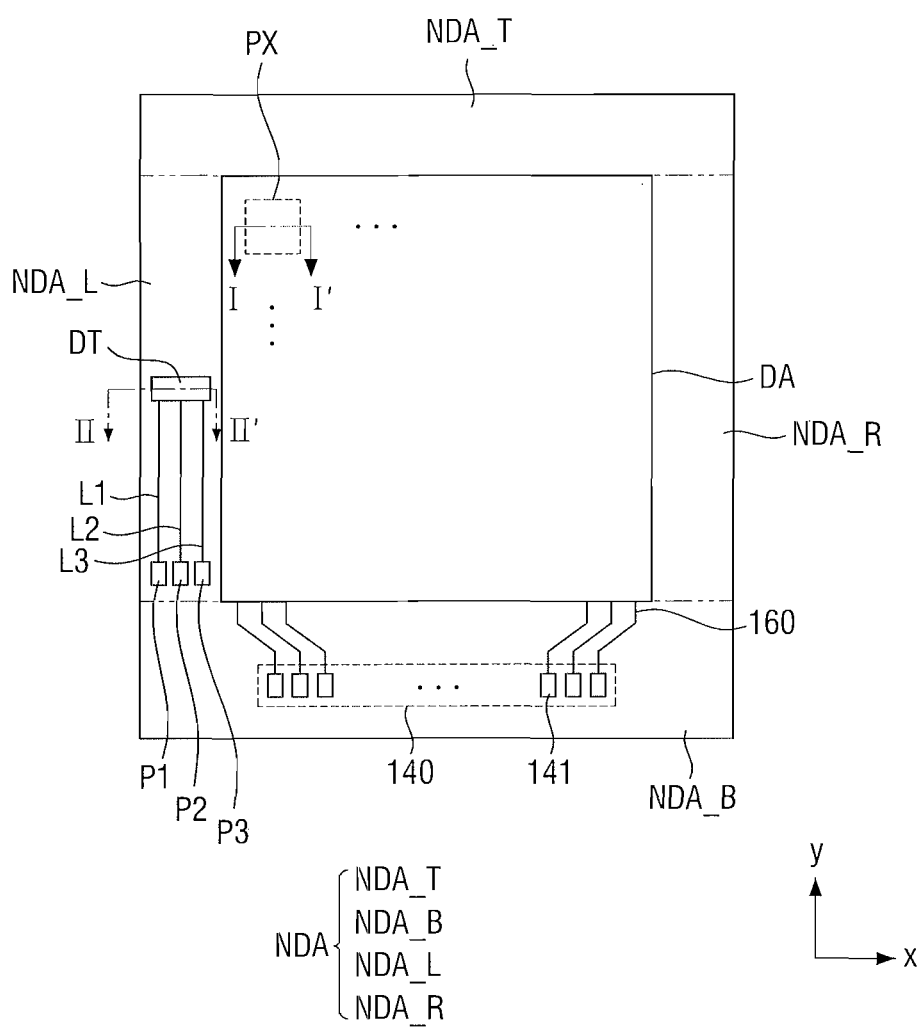
FIG. 1 illustrates a view showing the layout of a part of a display device according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Figure 2:
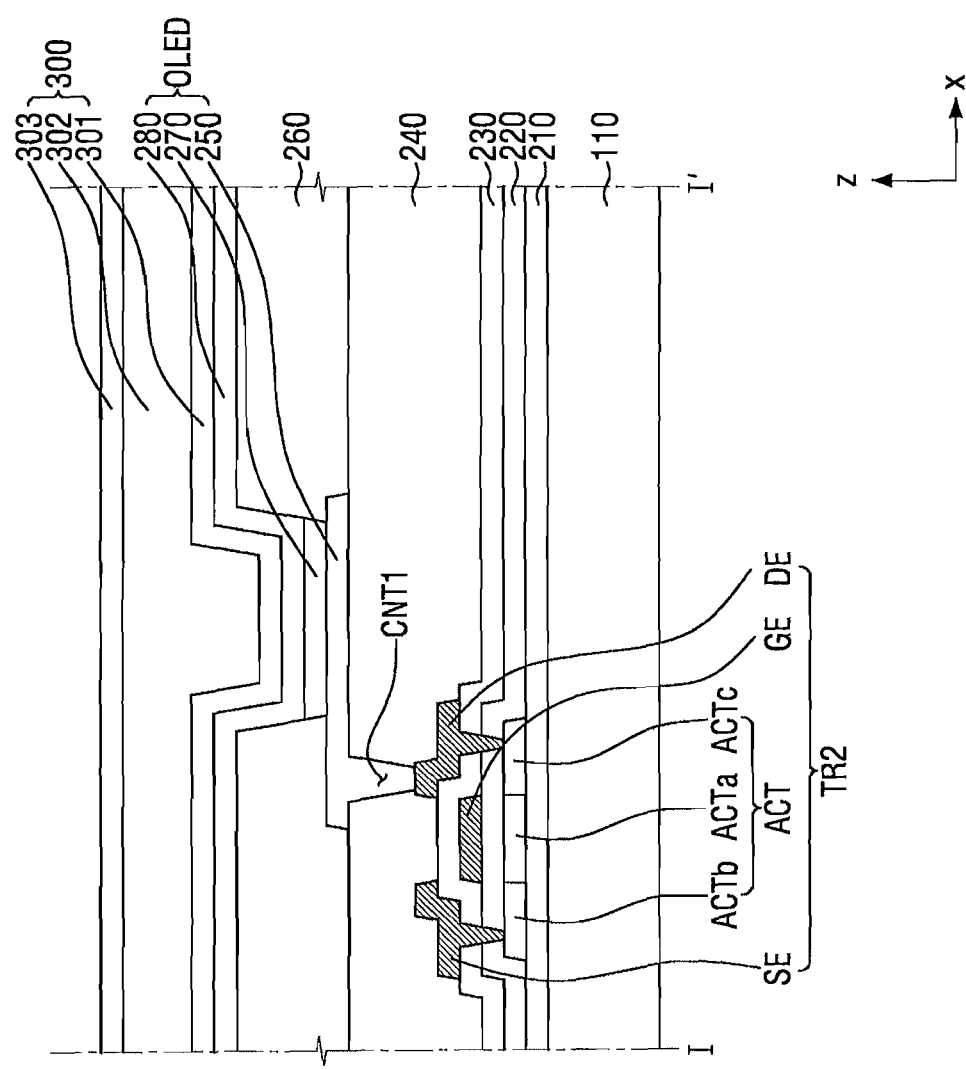
FIG. 2 illustrates a cross-sectional view taken along line I-I' of FIG. 1.
Figure 3:
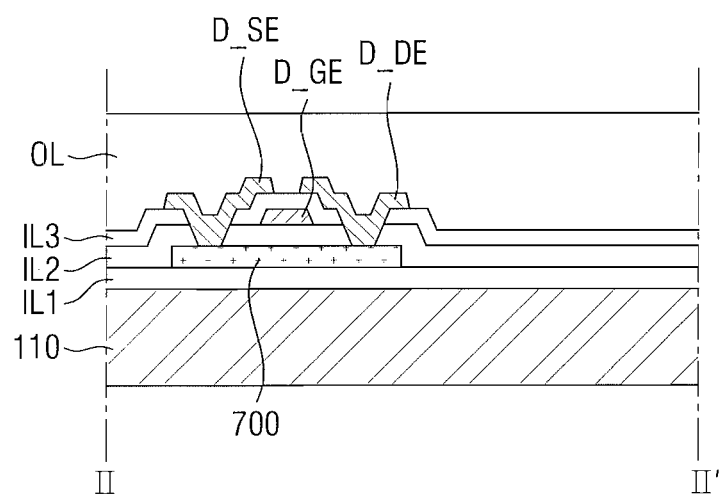
FIG. 3 illustrates a cross-sectional view taken along line II-II' of FIG. 1.
Figure 4:
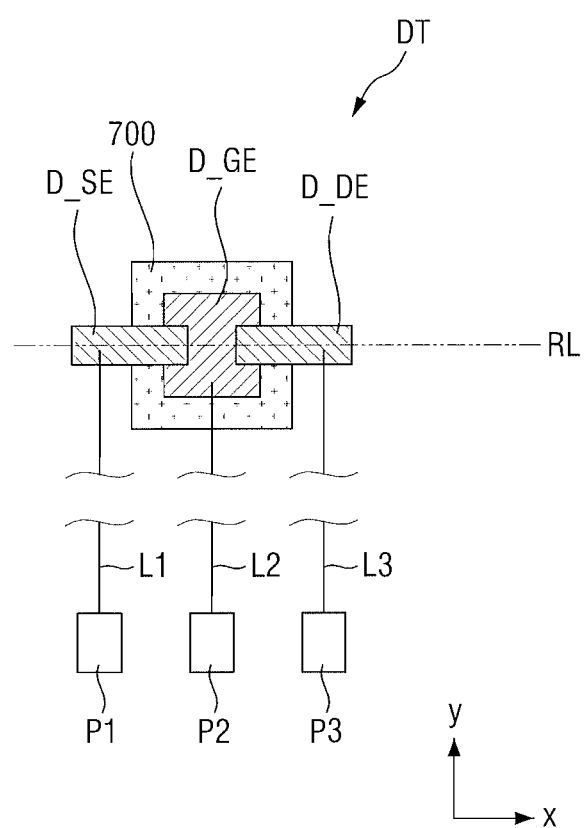
FIG. 4 illustrates a plan view of a part of the display device according to the exemplary embodiment shown in FIG. 1.

FIG. 1 is a view showing the layout of a part of a display device according to an exemplary embodiment of the present disclosure. FIG. 2 is a cross-sectional view taken along line I-I' of FIG. 1. FIG. 3 is a cross-sectional view taken along line II-II' of FIG. 1. FIG. 4 is a detailed plan view of a part of the display device according to the exemplary embodiment shown in FIG. 1.

Referring to FIGS. 1 to 4, a display device according to an exemplary embodiment of the present disclosure includes a first substrate 110, a dummy thin-film transistor DT, and a plurality of test pads P1, P2, and P3.

The first substrate 110 may provide a space or surface where elements to be described later are disposed. In an exemplary embodiment, the first substrate 110 may include a material, e.g., glass, quartz, a polymeric resin, and the like. The polymer material may be polyethersulphone (PES), polyacrylate (PA), polyacrylate (PAR), polyetherimide (PEI), polyethylenenapthalate (PEN), polyethyleneterephthalate (PET), polyphenylenesulfide (PPS), polyallylate, polyimide (PI), polycarbonate (PC), cellulosetriacetate (CAT), cellulose acetate propionate (CAP), combinations thereof or the like.

The first substrate 110 may be bent, folded or rolled at least partially. That is to say, the first substrate 110 may be a flexible substrate. The first substrate 110 may include a display area DA and a non-display area NDA. The display area DA is defined as an area for displaying an image. A plurality of pixels PX for displaying an image may be in the display area DA. The non-display area NDA is defined as an area that is disposed outside the display area DA and does not display an image.

The non-display area NDA may surround the display area DA, for example. For convenience of illustration, a non-display area NDA may be divided into sub-areas. In the exemplary embodiment shown in FIG. 1, the non-display area NDA may include a top non-display area NDA_T disposed on the upper side of the display area DA, a bottom non-display area NDA_B disposed on the lower side of the display area DA, a left non-display area NDA_L disposed on the left side of the display area DA, and a right non-display area NDA_R disposed on the right side of the display area DA. Thus, while the non-display area NDA is shown as surrounding, e.g., completely surrounding, the display area DA in FIG. 1, only one or more sub-areas of the non-display area NDA may be included.

In an exemplary embodiment, a pad unit 140 including a plurality of pads 141 may be in the bottom non-display area NDA_B. A plurality of first conductive lines 160 may be between the pad unit 140 and the display area DA. Each of the first conductive lines 160 may be electrically connected to the respective the pads 141. In an exemplary embodiment, the pad unit 140 may receive signals necessary for driving the display area DA. In an exemplary embodiment, the pad unit 140 may be connected to a drive integrated circuit to receive necessary signals.

In an exemplary embodiment, the driver integrated circuit may be mounted directly on the first substrate 110. In another exemplary embodiment, the driver integrated circuit may be formed on a separate circuit board and the circuit board may be electrically connected to the pad unit 140, so that the drive integrated circuit may provide necessary signals to the pad unit 140. That is to say, a signal generated in the drive integrated circuit may be provided to the display area DA through the first conductive lines 160.

As described above, a plurality of pixels PX may be in the display area DA. Hereinafter, a layered structure of a portion of the display device according to an exemplary embodiment of the present disclosure where a pixel PX is formed will be described with reference to FIG. 2, which illustrates a cross-section along lines I-I' in FIG. 1.

The buffer layer 210 may be on the first substrate 110. The buffer layer 210 may prevent moisture and oxygen from permeating into the first substrate 110. In addition, the buffer layer 210 may provide a flat surface over the first substrate 110. In an exemplary embodiment, the buffer layer 210 may include one of a silicon nitride (SiNx) layer, a silicon oxide (SiO$_2$) layer, a silicon oxynitride (SiOxNy) layer, and the like. The buffer layer 210 may be eliminated depending on the type of the first substrate 110, process conditions, etc.

A semiconductor layer including a semiconductor pattern ACT may be on the buffer 210. The semiconductor pattern ACT will be described as an example of the semiconductor layer. In an exemplary embodiment, the semiconductor pattern ACT may be made of one selected from polycrystalline silicon, single crystal silicon, low-temperature polycrystalline silicon, amorphous silicon, oxide semiconductor, a mixture thereof, and the like. In an exemplary embodiment, the semiconductor pattern ACT may include a channel region ACTa that is undoped, and a source region ACTb and a drain region ACTc doped with impurities. The source region ACTb is located on one side of the channel region ACTa and is electrically connected to a source electrode SE described later. The drain region ACTc is located on the other side of the channel region ACTa and is electrically connected to a drain electrode DE described later.

The first insulating layer 220 may be on the semiconductor layer including the semiconductor pattern ACT. In an exemplary embodiment, the first insulating layer 220 may be a gate insulating layer. In an exemplary embodiment, the first insulating layer 220 may be made of an inorganic insulating material, e.g., silicon oxide (SiOx) and silicon nitride (SiNx), BCB (BenzoCycloButene), an acryl-based material, an organic insulating material, e.g., polyimide, or a mixture thereof, and the like.

A gate conductor including the gate electrode GE may be on the first insulating layer 220. The gate electrode GE may overlap the semiconductor pattern ACT along a z-axis direction. For example, the gate conductor may include at least one of an aluminum (Al)-based metal including an aluminum alloy, a silver (Ag)-based metal including a silver alloy, a copper (Cu)-based metal including a copper alloy, a molybdenum (Mo)-based metal including molybdenum alloy, chromium (Cr), titanium (Ti), and tantalum (Ta).

A second insulating layer 230 may be on the gate conductor including the gate electrode GE. The second insulating layer 230 may be made of any of the materials noted above for the first insulating layer 220.

A data conductor including the source electrode SE and the drain electrode DE may be on the second insulating layer 230. The source electrode SE and the drain electrode DE are on the second insulating layer 230 such that they are spaced apart from each other along an x-axis direction. The data conductor may include at least one of: a metal, an alloy, a metal nitride, a conductive metal oxide, a transparent conductive material, and the like. In an exemplary embodiment, the data conductor may have a single-layer structure or a multi-layers structure made of nickel (Ni), cobalt (Co), Ti, Ag, copper (Cu), Mo, Al, beryllium (Be), niobium (Nb), gold (Au), iron (Fe), selenium (Se), Ta, and the like. In addition, an alloy formed by adding at least one of Ti, zirconium (Zr), tungsten (W), Ta, Nb, platinum (Pt), hafnium (Hf), oxygen (O), and nitrogen (N) to the above-listed metals may be used as the materials of the source electrode SE and the drain electrode DE.

The semiconductor pattern ACT, the gate electrode GE, the source electrode SE, and the drain electrode DE described above form a switching element TR2. The switching element TR2 is shown as a top-gate transistor in FIG. 2. Alternatively, the switching element TR2 may be a bottom-gate transistor.

A planarization layer 240 may be on the data conductor. The planarization layer 240 can increase the luminous efficiency of a pixel electrode 250 and an organic emission layer 270, which will be described later, provided thereon, by removing the level difference of the structure underneath the layer 240, e.g., the transistor TR2. In an exemplary embodiment, the planarization layer 240 may include an organic material. For example, the planarization layer 240 may include at least one of polyimide, polyacryl, polysiloxane, and the like. In another embodiment, the planarization layer 240 may include an inorganic material or a composite of an inorganic material and an organic material. A first contact hole CNT1 may be formed in the planarization layer 240 to expose at least a part of the drain electrode DE.

The pixel electrode 250 may be on the planarization layer 240. The pixel electrode 250 may be electrically connected to the drain electrode DE exposed via the first contact hole CNT1. That is, the pixel electrode 250 may be an anode electrode, i.e., a hole injection electrode. When the pixel electrode 250 is an anode electrode, the pixel electrode 250 may include a material having a high work function to facilitate hole injection. In addition, the pixel electrode 250 may be a reflective electrode, a transflective electrode, or a transmissive electrode. In an exemplary embodiment, the pixel electrode 250 may include a reflective material. The reflective material may include, e.g., at least one of: Ag, magnesium (Mg), Cr, Au, Pt, Ni, Cu, W, Al, aluminum-lithium (Al—Li), magnesium-indium (Mg—In), magnesium-silver (Mg—Ag), and the like. The pixel electrode 250 may be formed as a single layer or multiple layers in which two or more materials are stacked.

When the pixel electrode 250 is made up of multiple layers, the pixel electrode 250 may include, e.g., a reflective layer and a transparent or translucent electrode on the reflective layer. For another example, the pixel electrode 250 may include a reflective layer and a transparent or translucent electrode under the reflective layer. The transparent or transflective electrode may be made of at least one of: indium tin oxide (ITO), indium zinc oxide (IZO), zinc oxide (ZnO), $In_2O_3$ (Indium Oxide), indium gallium oxide (IGO), and aluminum zinc oxide (AZO). For example, the pixel electrode 250 may have a three-layer structure of ITO/Ag/ITO.

A pixel defining layer 260 may be on the pixel electrode 250. The pixel defining layer 260 includes an opening exposing at least a part of the pixel electrode 250. The pixel defining layer 260 may include an organic material or an inorganic material. In an exemplary embodiment, the pixel defining layer 260 may include, e.g., a photoresist, a polyimide resin, an acrylic resin, a silicon compound, a polyacrylic resin, and the like.

The organic emission layer 270 may be on the pixel electrode 250 and the pixel defining layer 260. More specifically, the organic emission layer 270 may be on the portion of the pixel electrode 250 exposed via the opening of the pixel defining layer 260. In an exemplary embodiment, the organic emission layer 270 may cover at least a part of the sidewall of the pixel defining layer 260.

In an exemplary embodiment, the organic emission layer 270 may emit one of red, blue, and green light, for example. In another embodiment, the organic emission layer 270 may emit white light or emit light of one of cyan, magenta, and yellow. When the organic emission layer 270 emits white light, either a white light-emitting material, or a stack structure of a red light-emitting layer, a green light-emitting layer, and a blue light-emitting layer may be used.

The common electrode 280 may be on the organic emission layer 270 and the pixel defining layer 260. In an exemplary embodiment, the common electrode 280 may cover an entirety of the organic emission layer 270 and the pixel defining layer 260. In an exemplary embodiment, the common electrode 280 may be a cathode electrode. In an exemplary embodiment, the common electrode 280 may include at least one of: Li, Ca, LiF/Ca, LiF/Al, Al, Ag and Mg. In addition, the common electrode 280 may be made of a material having a low work function. In an exemplary embodiment, the common electrode 280 may be transparent or transflective electrode made of materials noted above.

The above-described pixel electrode 250, organic emission layer 270, and common electrode 280 may constitute the organic light-emitting diode OLED. The organic light-emitting diode OLED may be multiple layer structure further including a hole injection layer (HIL), a hole transport layer (HTL), an electron transport layer (ETL), an electron injection layer (EIL), and the like.

An encapsulation layer 300 may be on the common electrode 280. The encapsulation layer 300 can prevent contaminants, e.g., moisture and air, from the outside, from permeating into the organic light-emitting diode OLED. In an exemplary embodiment, the encapsulation layer 300 may include a first inorganic layer 301, an organic layer 302, and a second inorganic layer 303.

The first inorganic layer 301 may be on the common electrode 280. The first inorganic layer 301 may include at least one of SiOx, SiNx, SiONx, and the like. The organic layer 302 may be on the first inorganic layer 301. The organic layer 302 may include one of epoxy, acrylate, urethane acrylate, and the like. The organic layer 302 may provide a flat surface over the level difference created by the pixel defining layer 260. The second inorganic layer 303 may be on the organic layer 302, and may be any of the materials noted above the first inorganic layer 301.

Each of the first inorganic layer 301, the organic layer 302 and the second inorganic layer 303 shown in FIG. 3 is made up of a single layer. Alternatively, at least one of the first inorganic layer 301, the organic layer 302, and the second inorganic layer 303 may be made up of multiple layers.

In another exemplary embodiment, the encapsulation layer 300 may include a hexamethyldisiloxane (HMDSO) layer. More specifically, the encapsulation layer 300 may include the first inorganic layer 301, the second inorganic layer 303, and the HMDSO layer between the first inorganic layer 301 and the second inorganic layer 303. That is, the above-described organic layer 302 may be replaced with the HMDSO layer. In an exemplary embodiment, the HMDSO layer may be formed in the same chamber after forming the first inorganic layer 301. By doing so, the process of forming the encapsulation layer 300 can become simpler. In addition, as the encapsulation layer 300 includes the HMDSO layer that is capable of absorbing stress, the encapsulation layer 300 can have sufficient flexibility.

Referring back to FIG. 1, at least a dummy thin-film transistor DT and a plurality of test pads P1, P2 and P3 may be in the non-display area NDA. FIG. 1 shows an example where the dummy thin-film transistor DT is in the left non-display area NDA_L. Alternatively, the dummy thin-film transistor DT may be in one or more areas of the top non-display area NDA_T, the bottom non-display area NDA_B, the left non-display area NDA_L, and the right non-display area NDA_R.

The plurality of test pads P1, P2 and P3 may be in the non-display area NDA. In the example shown in FIG. 1, there are three test pads. As will be described in detail later, a single dummy thin-film transistor DT uses three test pads. That is to say, if n dummy thin-film transistors DTs are disposed in the non-display area NDA, 3n test pads may be disposed accordingly.

In the following description, the test pads shown in FIG. 1 will be referred to as a first test pad P1, a second test pad P2, and a third test pad P3 for convenience of illustration. In an exemplary embodiment, the test pads and the dummy thin-film transistor DT may be electrically connected through a plurality of conductive lines. Specifically, the first test pad P1, the second test pad P2 and the third test pad P3 may be connected to the dummy thin-film transistor DT through a first line L1, a second line L2 and a third line L3, respectively.

In an exemplary embodiment, the first line L1, the second line L2 and the third line L3 may extend in one or more directions. The first line L1, the second line L2 and the third line L3 may extend in a straight line along a y-axis direction in the example shown in FIG. 1. Alternatively, the first line L1 the second line L2 and the third line L3 may have at least one non-linear or bent portion depending on design choice.

Hereinafter, the dummy thin-film transistor DT and the test pads P1, P2 and P3 will be described in detail with reference to FIGS. 3 and 4. FIG. 3 is a cross-sectional view of a dummy thin-film transistor DT taken along II-II' in FIG. 1. FIG. 4 is a detailed plan view of the dummy thin-film transistor DT.

Referring to FIG. 3, a first insulating layer IL1 may be on the second substrate 110. In an exemplary embodiment, the first insulating layer IL1 may include one of any of the materials noted above for the buffer layer 210. In an exemplary embodiment, the first insulating layer IL1 may be made of the same material as the buffer layer 210 in the display area DA. In other words, the first insulating layer IL1 may be formed together with the buffer layer 210 in the display area DA via the same process or may be formed separately via different processes and/or different materials. When the buffer layer 210 is not included in the display area DA, the first insulating layer IL1 may not be included.

A dummy semiconductor pattern layer 700 may be on the first insulating layer IL1. In an exemplary embodiment, the dummy semiconductor pattern layer may be made of any of the materials noted above for the semiconductor pattern ACT in the display area. In an exemplary embodiment, the dummy semiconductor pattern layer 700 may be made of the same material as the semiconductor pattern ACT. In other words, the dummy semiconductor pattern layer 700 may be formed together with the semiconductor pattern ACT in the display area DA via the same process or may be formed separately via different processes and/or materials.

A second insulating layer IL2 may be on the semiconductor pattern layer ACT. The second insulating layer IL2 may be made of any of the materials noted above for the first insulating layer 220 in the display area DA. In an exemplary embodiment, the second insulating layer IL2 may be made of the same material as the first insulating layer 220 in the display area DA. In other words, the second insulating layer IL2 may be formed together with the first insulating layer 220 in the display area DA via the same process or may be formed separately via different processes and/or materials.

In an exemplary embodiment, a dummy gate electrode D_GE may be on the second insulating layer IL2. The dummy gate electrode D_GE may be such that it overlaps with the dummy semiconductor pattern layer 700 along the z-axis direction. The dummy gate electrode D_GE may include any of the materials noted above for the gate electrode GE in the display area DA. In an exemplary embodiment, the dummy gate electrode D_GE may be made of the same material as the gate electrode GE in the display area DA. In other words, the dummy gate electrode D_GE and the gate electrode GE may be formed together via the same process or may be formed separately via different processes and/or materials.

A third insulating layer IL3 may be on the dummy gate electrode D_GE. In an exemplary embodiment, the third insulating layer IL3 may be made of any of the materials noted above for the second insulating layer 230 in the display area DA. The third insulating layer IL3 may be made of the same material as the second insulating layer 230 in the display area DA. In other words, the third insulating layer IL3 and the second insulating layer 230 may be formed together via the same process or may be formed separately via different processes and/or materials.

A dummy source electrode D_SE and a dummy drain electrode D_DE may be disposed on the third insulating layer IL3. The dummy source electrode D_SE may be spaced apart from the dummy drain electrode D_DE. The dummy source electrode D_SE and the dummy drain electrode D_DE may include any of the materials noted above for the source electrode SE and the drain electrode DE in the display area DA. In an exemplary embodiment, the dummy source electrode D_SE and the dummy drain electrode D_DE may be made of the same material as the source electrode SE and the drain electrode DE in the display area DA, respectively. In other words, the dummy source electrode D_SE and the dummy drain electrode D_DE may be formed together via the same process or may be formed separately via different processes and/or materials.

The dummy semiconductor pattern layer 700, the dummy gate electrode D_GE, the dummy source electrode D_SE, and the dummy drain electrode D_DE may form a dummy thin-film transistor DT. The dummy thin-film transistor DT is shown as a top-gate thin-film transistor in the example shown in FIG. 3. Alternatively, the dummy thin-film transistor DT may be implemented as a bottom-gate thin-film transistor.

In an exemplary embodiment, the dummy thin-film transistor DT may have substantially the same shape as the switching element TR2 in the display area DA. That is to say, the dummy thin-film transistor DT may have substantially the same shape as the switching element TR2 in the display area DA in the cross sectional and plan views.

In an exemplary embodiment, an organic layer OL may be on the dummy thin-film transistor DT. The organic layer OL may be made of any of the materials noted above for the planarization layer 240 in the display area DA. In an exemplary embodiment, the organic layer OL may be made of the same material as the planarization layer 240 in the display area DA. In other words, the organic layer OL and the planarization layer 240 may be formed together via the same process or may be formed separately via different processes and/or materials.

The organic layer OL completely covers the dummy thin-film transistor DT in the example shown in FIG. 3. Alternatively, the organic layer OL may partially cover the dummy thin-film transistor DT. In yet another exemplary embodiment, the organic layer OL may be eliminated. Then, the dummy thin-film transistor DT may be at least partially exposed. The encapsulation layer 300 in the display area DA may extend into the non-display area NDA to at least partially cover the dummy thin-film transistor DT.

FIG. 4 is a view showing the layout of a part of a display device according to an exemplary embodiment of the present disclosure. The insulating layers are not shown in FIG. 4 for convenience of illustration.

Referring to FIG. 4, the dummy gate electrode D_GE may overlap, e.g., completely overlap, the dummy semiconductor pattern layer 700 along the z-axis direction. In addition, the dummy source electrode D_SE and the dummy drain electrode D_DE may at least partially overlap the dummy semiconductor pattern layer 700 and/or the dummy gate electrode D_GE along the z-axis direction.

For convenience of illustration, a reference line RL is defined herein. The reference line RL may refer to an imaginary straight line connecting the source electrode SE with the drain electrode DE in a thin-film transistor or connecting the dummy source electrode D_SE with the dummy drain electrode D_DE in a dummy thin-film transistor. That is to say, a single reference line RL may be defined for each thin-film transistor.

The reference line RL may be extend across the space separating the source electrode SE and the drain electrode DE or separating the dummy source electrode D_SE and the dummy drain electrode D_DE. In an exemplary embodiment, the source electrode SE, the space, and the drain electrode DE or the dummy source electrode D_SE, the space and the dummy drain electrode D_DE may be arranged in these orders along the reference line RL.

FIG. 4 shows that the dummy source electrode D_SE, the spacing and the dummy drain electrode D_GE are arranged in this order along the reference line RL. In an exemplary embodiment, the reference line RL may extends in a direction, e.g., the direction may be the x-axis direction. In an exemplary embodiment, the direction in which the reference line RL of one dummy thin-film transistor DT in the non-display area NDA extends may coincide with the direction in which the reference line of the switching element TR2 in the display area DA extends. In other words, in the exemplary embodiment shown in FIG. 3, the reference line of the switching element TR2 in the display area DA may extend parallel to the x-axis.

As will be described later in detail, the dummy thin-film transistor DT may be tested on behalf of the switching element TR2 disposed in the display area DA. Specifically, when the switching element TR2 may not be directly tested during various processes of evaluating the reliability of the display device, by testing the dummy thin-film transistor DT having substantially the same mechanical and electrical characteristics as those of the switching device TR2, test results of the switching element TR2 can be derived.

For the same purpose, when the reference line RL of the dummy thin-film transistor DT and the switching element TR2 extend in the same direction, the influence by a particular mechanical stimulation may be substantially the same on the dummy thin-film transistor DT as well as the switching element TR2. This allows the test results obtained by using the dummy transistor DT to be used for reliably deriving the results of switching element TR2. That is to say, the reliability of the test results by using the dummy thin-film transistor DT can be improved by such configuration.

In an exemplary embodiment, each of the dummy source electrode D_SE and the dummy drain electrode D_DE may have a bar shape extended in the longitudinal direction, e.g., the direction along which the reference line RL extends.

In an exemplary embodiment, the dummy source electrode D_SE may be electrically connected to the first test pad P1. Specifically, the dummy source electrode D_SE may be connected to the first test pad P1 through the first line L1. That is to say, a first end of the first line L1 may be connected to the dummy source electrode D_SE and a second end thereof may be connected to the first test pad P1. An upper surface of the first test pad P1 may be at least partially exposed in order to be in contact with a first connection pad C1 described later. In an exemplary embodiment, the first test pad P1 may be made of the same material as the dummy source electrode D_SE and/or the dummy gate electrode D_GE. In other words, the second test pad P2 may be formed together with the dummy source electrode D_SE to be disposed on the same layer as the dummy source electrode D_SE, or may be formed together with the dummy gate electrode D_GE to be disposed on the same layer as the dummy gate electrode D_GE.

In an exemplary embodiment, the dummy gate electrode D_GE may be electrically connected to the second test pad P2. Specifically, the dummy gate electrode D_GE may be connected to the second test pad P2 through the second line L2. That is to say, a first end of the second line L2 may be connected to the dummy gate electrode D_GE and a second end thereof may be connected to the second test pad P2. An upper surface of the second test pad P2 may be at least partially exposed in order to be in contact with a second connection pad C2 described later.

In an exemplary embodiment, the second test pad P2 may be made of the same material as the dummy source electrode D_SE and/or the dummy gate electrode D_GE. In other words, the second test pad P2 may be formed together with the dummy source electrode D_SE to be on the same layer as the dummy source electrode D_SE, or may be formed together with the dummy gate electrode D_GE to be disposed on the same layer as the dummy gate electrode D_GE.

In an exemplary embodiment, the dummy drain electrode D_DE may be electrically connected to the third test pad P3. Specifically, the dummy drain electrode D_DE may be connected to the third test pad P3 through the third line L3. That is to say, a first end of the third line L3 may be connected to the dummy drain electrode D_DE and a second end thereof may be connected to the third test pad P3. An upper surface of the third test pad P3 may be at least partially exposed in order to be in contact with a third connection pad C3 described later.

In an exemplary embodiment, the third test pad P3 may be made of the same material as the dummy source electrode D_SE and/or the dummy gate electrode D_GE. In other words, the third test pad P3 may be formed together with the dummy source electrode D_SE to be disposed on the same layer as the dummy source electrode D_SE, or may be formed together with the dummy gate electrode D_GE to be disposed on the same layer as the dummy gate electrode D_GE.

In an exemplary embodiment, each of the dummy source electrode D_SE, the first line L1, and the first test pad P1 may be a single island pattern that is not electrically connected to other elements until connected to an apparatus for testing described later. Similarly, each of the dummy gate electrode D_GE, the second line L2, and the second test pad P2 may be a single island pattern that is not electrically connected to other elements until connected to the apparatus for testing described later. Additionally, each of the dummy drain electrode D_DE, the third line L3, and the third test pad P3 may be a single island pattern that is not electrically connected to other elements until connected to the apparatus for testing described later.

Figure 11:
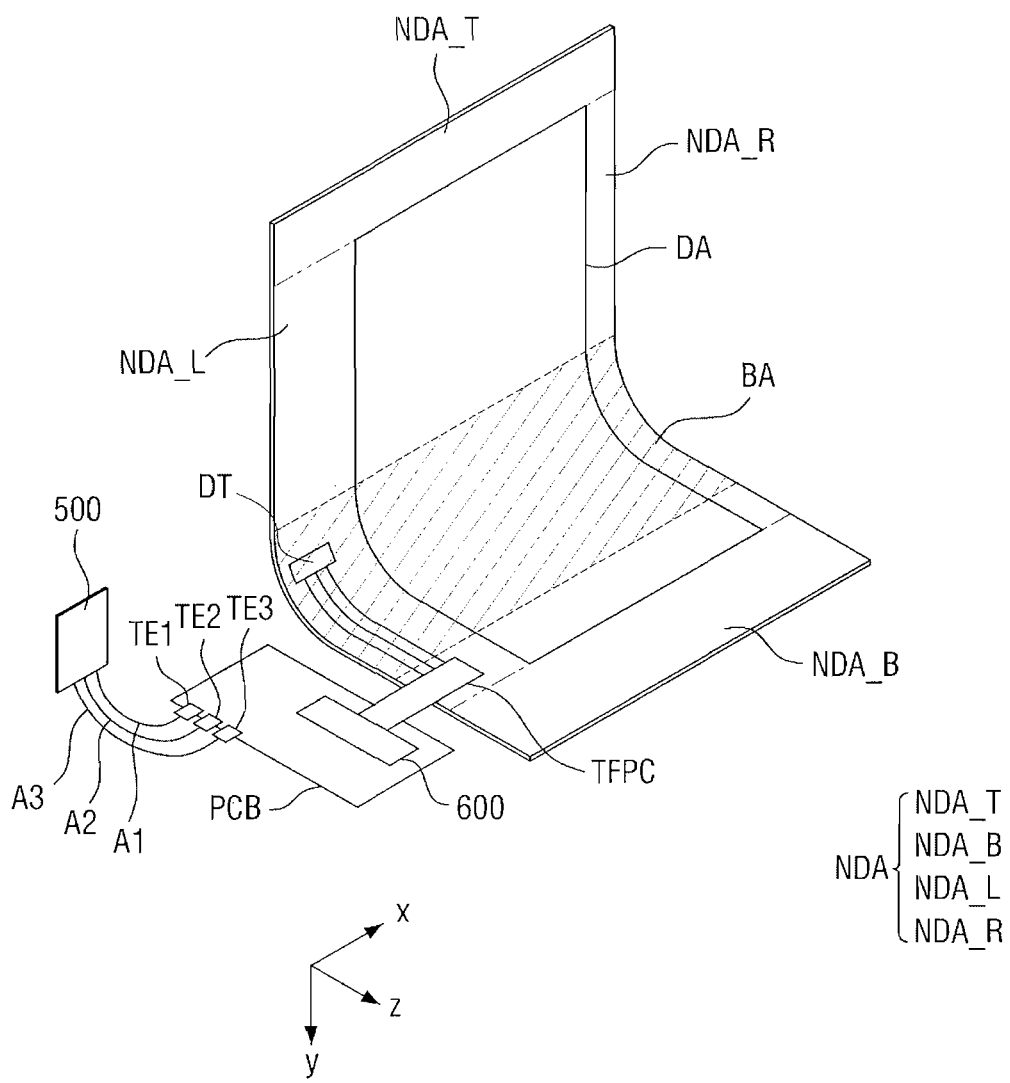
FIG. 11 illustrates a perspective view of a display device according to an exemplary embodiment of the present disclosure.

In an exemplary embodiment, a bending area BA may be formed on the first substrate 110 (see FIG. 11). Specifically, when an external force is applied to the first substrate 110, the first substrate 110 may be at least partially bent, folded, or rolled. Herein, the portion of the first substrate 110 which is bent, folded, or rolled is defined as the bending area BA. That is to say, the bending area BA may be defined as an area on the first substrate 110 which has a curvature that is not zero.

The bending area BA may be formed such that it at least partially traverses the display area DA and the non-display area NDA. In an exemplary embodiment, the bending area BA may overlap the dummy thin-film transistor DT. Such a structure may be for checking the characteristics of the display device according to the bending, as will be described later. When a test for evaluating characteristics of a bent substrate is performed, the first substrate 110 may be folded in a direction parallel to the x-axis direction or may be folded in a direction parallel to the y-axis direction. By disposing the dummy thin-film transistor DT1 in the left non-display area NDA_L as shown in FIG. 5 the influence on the dummy thin-film transistor DT1 when the first substrate 110 is folded in the direction parallel to the x-axis direction may be detected.

Hereinafter, a display device according to another exemplary embodiment of the present disclosure will be described. In the following description, the same or similar elements will be denoted by the same or similar reference numerals, and redundant descriptions will be omitted or briefly described.

Figure 5:
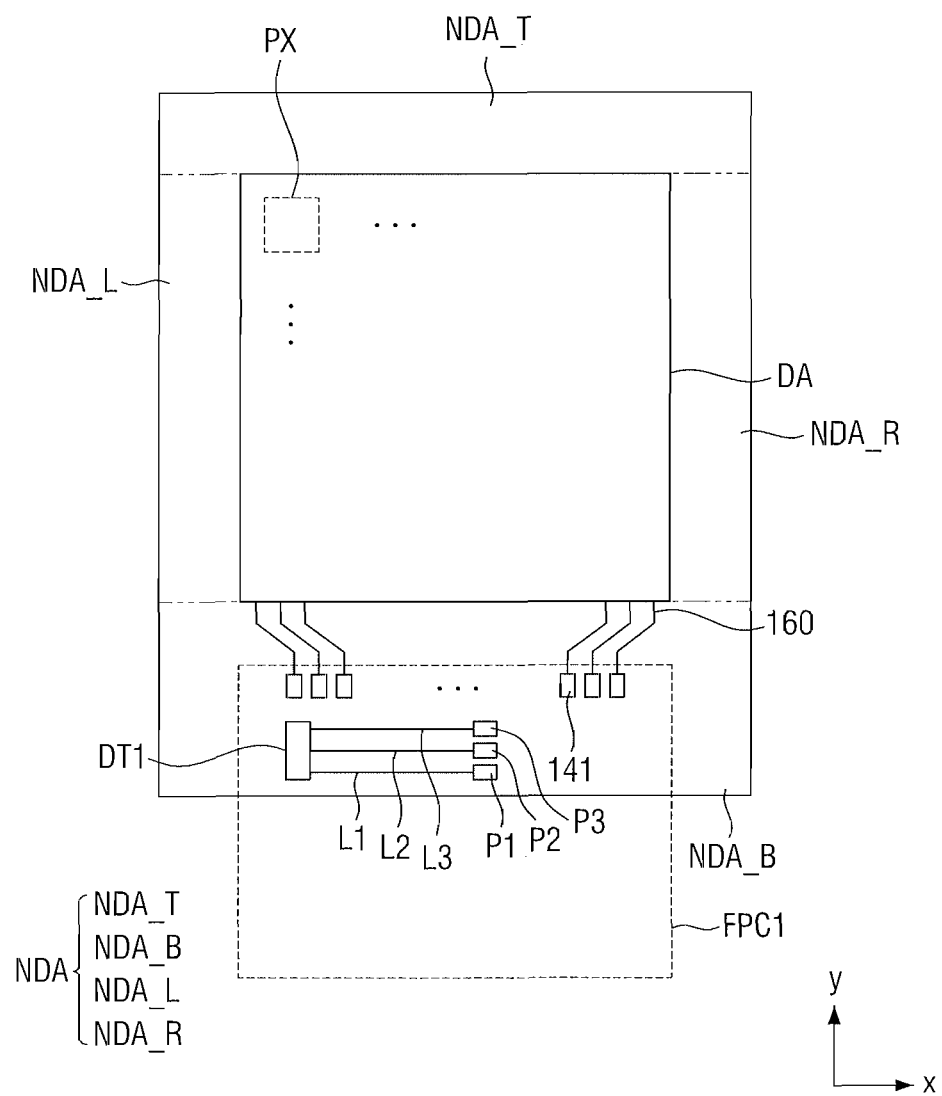
FIG. 5 illustrates a view showing the layout of a display device according to another exemplary embodiment of the present disclosure.

FIG. 5 is a view showing the layout of a display device according to another exemplary embodiment of the present disclosure. Referring to FIG. 5, in an exemplary embodiment, the display device may further include a flexible printed circuit board FPC1 connected to the pad unit 140. In an exemplary embodiment, the pad unit 140 may be electrically connected to the flexible printed circuit board FPC1. Then, the flexible printed circuit board FPC1 may at least partially cover the bottom non-display area NDA_B. In an exemplary embodiment, the pad unit 140 and the flexible printed circuit board FPC1 may be attached together by an anisotropic conductive film (ACF). The anisotropic conductive film may contain conductive particles.

A plurality of conductive lines and a drive integrated circuit may be disposed on the flexible printed circuit board FPC1. The drive integrated circuit generates signals necessary for driving the display device. Such signals may be transmitted to the display area DA through the pad unit 140.

In an exemplary embodiment, the dummy thin-film transistor DT1 may be on the lower end of the pad unit 140, e.g., on the bottom non-display area NDA_B with the pad unit 140 between the dummy thin-film transistor DT1 and the display region DA. Then, the dummy thin-film transistor DT1 may be at least partially covered with the flexible printed circuit board FPC1. In other words, the dummy thin-film transistor DT1 may be at least partially overlap the flexible printed circuit board FPC1 along the z-axis direction.

When a test for evaluating characteristics of a bent substrate is performed, the first substrate 110 may be folded in a direction parallel to the x-axis direction or may be folded in a direction parallel to the y-axis direction. By disposing the dummy thin-film transistor DT1 in the bottom non-display area NDA_B as shown in FIG. 5, the influence on the dummy thin-film transistor DT1 when the first substrate 110 is folded in the direction parallel to the y-axis direction may be detected.

Figure 6:
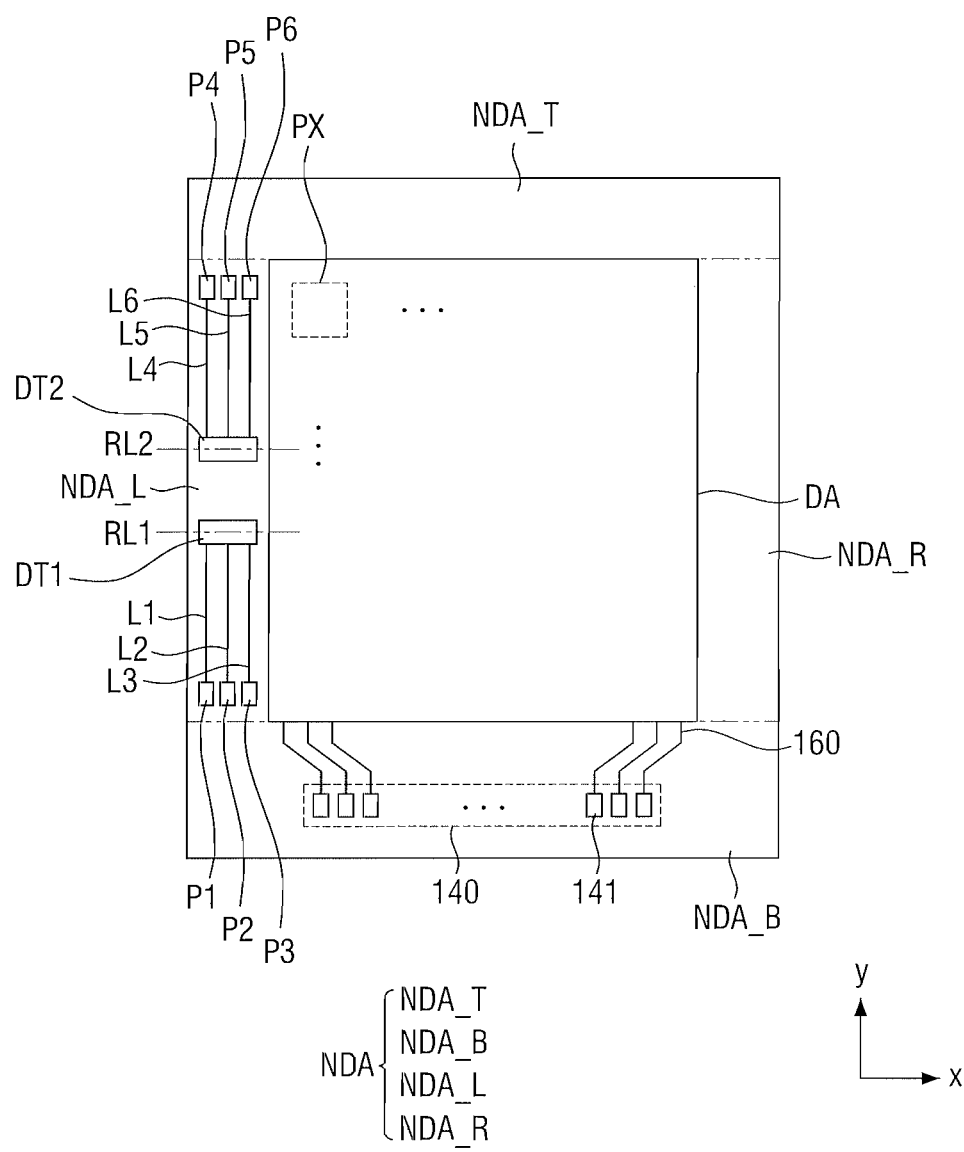
FIG. 6 illustrates a view showing the layout of a display device according to another exemplary embodiment of the present disclosure.

FIG. 6 is a view showing the layout of a display device according to another exemplary embodiment of the present disclosure. Referring to FIG. 6, in an exemplary embodiment, a plurality of dummy thin-film transistors may be in the non-display area NDA.

For convenience of illustration, the plurality of dummy thin-film transistors is referred to as a first dummy thin-film transistor DT1 and a second dummy thin-film transistor DT2. The first dummy thin-film transistor DT1 and the second dummy thin-film transistor DT2 may be substantially identical to the above-described dummy thin-film transistors except for the locations they are when viewed from the top. In an exemplary embodiment, two or more dummy thin-film transistors may be arranged in parallel in the non-display area. In the example shown in FIG. 6, the first dummy thin-film transistor DT1 and the second dummy thin-film transistor DT2 are arranged in parallel in the y-axis direction, e.g., may be a mirror image of on another along the x-axis direction.

A first reference line RL1 of the first dummy thin-film transistor DT1 may be defined, and a second reference line RL2 of the second dummy thin-film transistor DT2 may be defined. In an exemplary embodiment, the direction in which the first reference line RL1 may extend parallel to the second reference line RL2 is extended. The first reference line RL1 and the second reference line RL2 extend in the x-axis direction in the example shown in FIG. 6. Alternatively, the first reference line RL1 and the second reference line RL2 may extend in the y-axis direction or an oblique direction on the xy coordinate plane.

The first dummy thin-film transistor DT1 may be connected to the first test pad P1, the second test pad P2 and the third test pad P3, as described above. Similarly, the second dummy thin-film transistor DT2 may be electrically connected to a fourth test pad P4, a fifth test pad P5, and the sixth test pad P6. Although the test pads are denoted by different numerals, the fourth test pad P4, the fifth test pad P5 and the sixth test pad P6 may be connected to the second dummy thin-film transistor DT2 in substantially the same manner as the first test pad P1, the second test pad P2, and the third test pad P3 are connected to the first dummy thin-film transistor DT1. Therefore, a detailed description thereon will be omitted.

Figure 7:
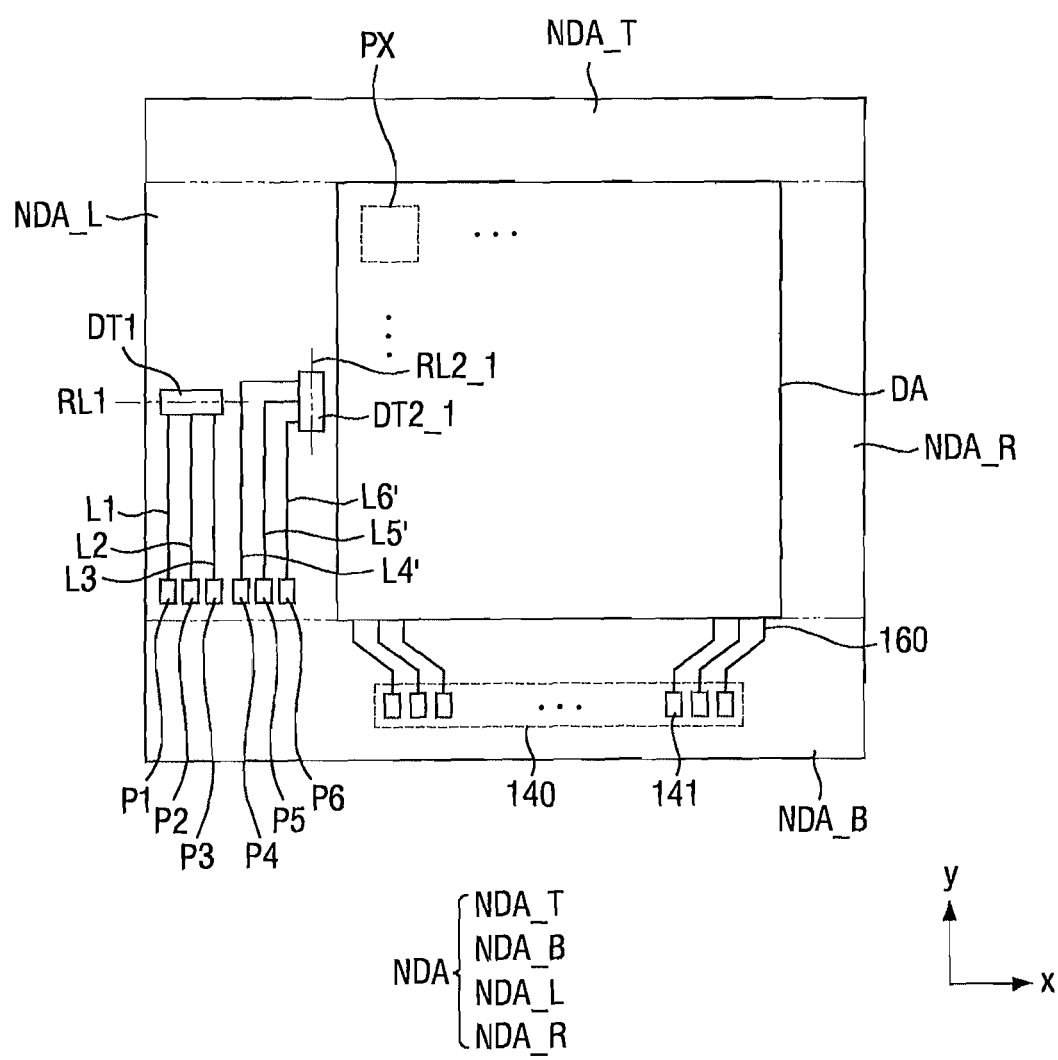
FIG. 7 illustrates a view showing the layout of a display device according to another exemplary embodiment of the present disclosure.

In an exemplary embodiment, the first test pad P1, the second test pad P2, and the third test pad P3 may be parallel with, e.g., arranged along a same line, the fourth test pad P4, the fifth test pad P5 and the sixth test pad P6 (see FIG. 7). In another exemplary embodiment, the first test pad P1, the second test pad P2, and the third test pad P3 may be opposite to the fourth test pad P4, the fifth test pad P5 and the sixth test pad P6 (see FIG. 6). Then, the first dummy thin-film transistor DT1 and the second dummy thin-film transistor DT2 may be between the first test pad P1, the second test pad P2 and the third test pad P3 arranged in parallel and the fourth test pad P4, the fifth test pad P5 and the sixth test pad P6 arranged in parallel.

Figure 8:
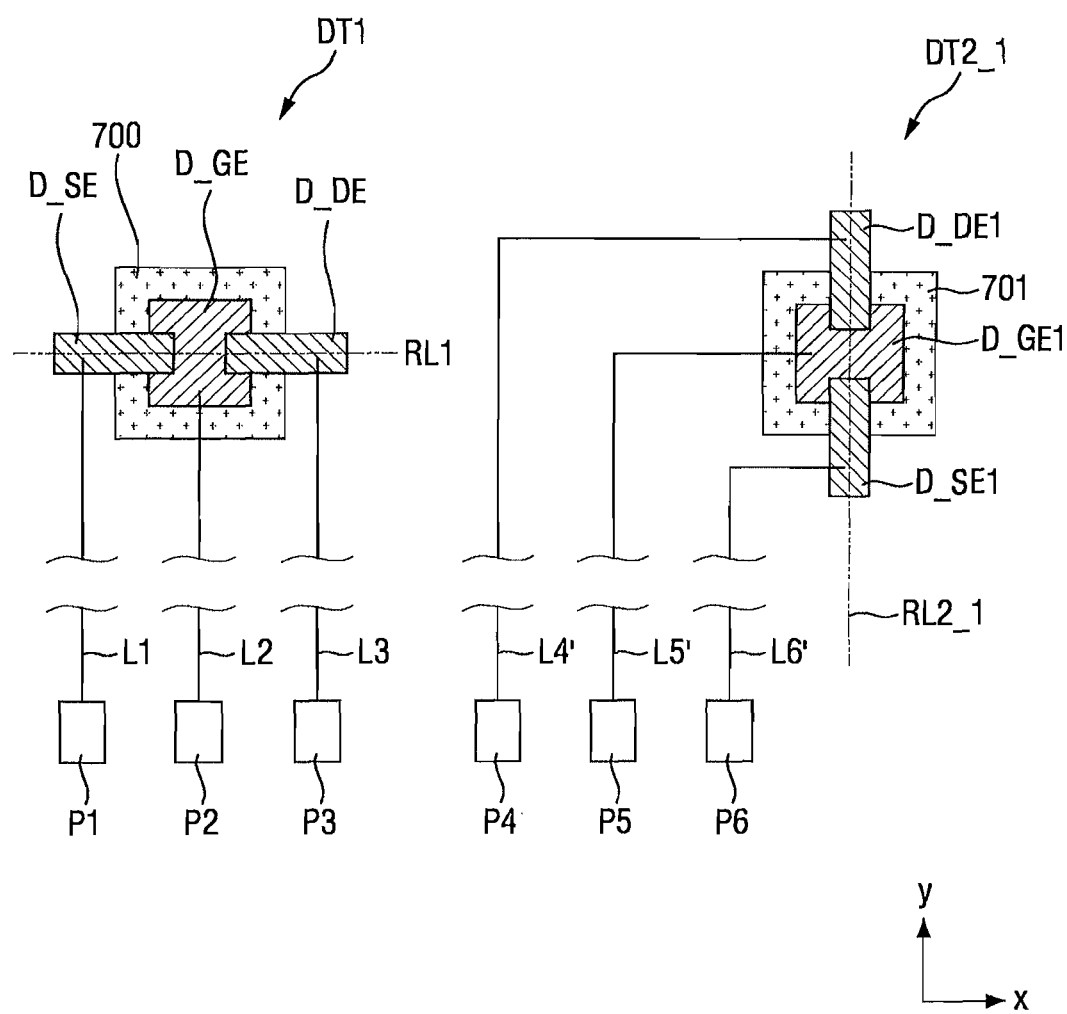
FIG. 8 illustrates a view showing the layout of a part of the display device of FIG. 7.

FIG. 7 is a view showing the layout of a display device according to another exemplary embodiment of the present disclosure. FIG. 8 is a view showing the layout of a part of the display device of FIG. 7. Referring to FIG. 7, in an exemplary embodiment, the plurality of dummy thin-film transistors may be extended in different directions.

In an exemplary embodiment, the direction in which the first reference line RL1 of the first dummy thin-film transistor DT1 extends may be different from the direction in which the second reference line RL2_1 of the second dummy thin-film transistor DT2_1 extend, e.g., may be perpendicular thereto. For example, the first reference line RL1 may extend along the x-axis direction and the second reference line RL2 may be extend along the y-axis direction. Alternatively, an angle formed between the first reference line RL1 and the second reference line RL2 may be an oblique angle, e.g., an acute angle or an obtuse angle.

As will be described in detail later, the first substrate 110 may be bent in different directions. In addition, the physical influence on the thin-film transistors may vary depending on the bending directions. As described above, by disposing a plurality of dummy thin-film transistors having reference lines that extend in different directions, the influence on the thin-film transistors from different bending directions may be determined. This is because the thin-film transistors having different reference lines receive different external forces even when the first substrate is bent in a single direction.

FIG. 8 is a view for illustrating the thin-film transistors shown in FIG. 7 in detail. The first dummy thin-film transistor DT1 and the second dummy thin-film transistor DT2_1 may have substantially the same structure as shown in FIG. 4. Specifically, the second dummy thin-film transistor DT2_1 may also include a dummy drain electrode D_DE1, a dummy gate electrode D_GE1, a dummy semiconductor pattern layer 701, and a dummy source electrode D_SE1, like the first dummy thin-film transistor DT1. It is to be noted that the orientations thereof are different. Specifically, as described above, the first reference line RL1 and the second reference line RL2_1 may extend in different, e.g., orthogonal, directions.

In addition, the second dummy thin-film transistor DT2_1 may be electrically connected to the fourth test pad P4, the fifth test pad P5 and the sixth test pad P6. Although the test pads are denoted by different numerals, the fourth test pad P4, the fifth test pad P5 and the sixth test pad P6 may be connected to the second dummy thin-film transistor DT2 in substantially the same manner as the first test pad P1, the second test pad P2 and the third test pad P3 are connected to the first dummy thin-film transistor DT1. Therefore, a detailed description thereon will be omitted.

As shown in FIG. 8, the pads P1 to P6 may be arranged in a single line. Then, the lines L4' to L6' may be bent to connect the pads P4 to P6 to the second dummy thin-film transistor DT2_1.

Figure 9:
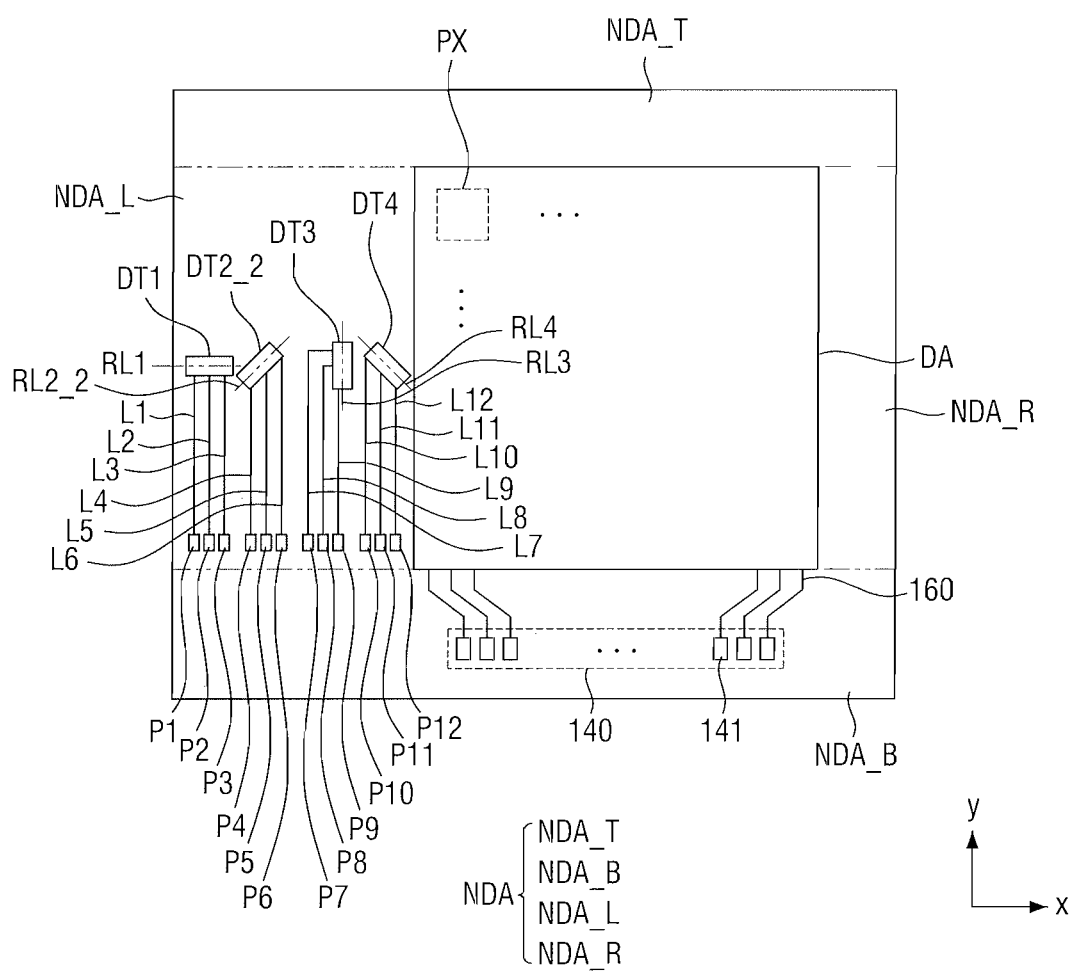
FIG. 9 illustrates a view showing the layout of a display device according to another exemplary embodiment of the present disclosure.

FIG. 9 is a view showing the layout of a display device according to another exemplary embodiment of the present disclosure. Referring to FIG. 9, in an exemplary embodiment, four dummy thin-film transistors may be disposed in the non-display area NDA.

In the following description, the four dummy thin-film transistors are referred to as a first dummy thin-film transistor DT1, a second dummy thin-film transistor DT2_2, a third dummy thin-film transistor DT3 and a fourth dummy thin-film transistor DT4 in order to distinguish one from another.

The first dummy thin-film transistor DT1, the second dummy thin-film transistor DT2_2, the third dummy thin-film transistor DT3, and the fourth dummy thin-film transistor DT4 may have substantially the same structure as the dummy thin-film transistors of the display device according to the above-described exemplary embodiments of the present disclosure.

The different dummy thin-film transistors are at different angles when viewed from the top. Specifically, a first reference line RL1 may be defined in the first dummy thin-film transistor DT1, a second reference line RL2_2 may be defined in the second dummy thin-film transistor DT2_2, a third reference line RL3 may be defined in the third dummy thin-film transistor DT3, and a fourth reference line RL4 may be defined in the fourth dummy thin-film transistor DT4. In an exemplary embodiment, the first reference line RL1, the second reference line RL2_2, the third reference line RL3 and the fourth reference line RL4 may extend in different directions, e.g., all may extend in different directions.

For example, as shown in FIG. 9, the first reference line RL1 may extend along the x-axis direction, the second reference line RL2_2 may be extend at an oblique angle having a positive slope on the xy plane, the third reference line RL3 may extends along the y-axis direction, and the fourth reference line RL4 may extend at an oblique direction having a negative slope on the xy plane. In an exemplary embodiment, the direction in which the first reference line RL1 extends may be different from the direction in which the second reference line RL2 extends by 45 degrees, either in the clockwise direction or in the counterclockwise direction. In addition, the direction in which the first reference line RL1 extends may be different from the direction in which the third reference line RL3 is extended by 90 degrees, either in the clockwise direction or in the counterclockwise direction. In an exemplary embodiment, the direction in which the first reference line RL1 extends may be different from the direction in which the fourth reference line RL4 extends by 45 degrees either in the clockwise direction or in the counterclockwise direction. It is to be noted that the direction in which the fourth reference line RL4 extends may be different from the direction in which the second reference line RL2 extends by 90 degrees, either in the clockwise direction or in the counterclockwise direction.

As will be described in detail later, the first substrate 110 may be bent in different directions. In addition, the physical influence on the thin-film transistors may vary depending on the bending directions. As described above, by providing a plurality of dummy thin-film transistors having reference lines that extend in different directions, the influence on the thin-film transistors from different bending directions may be checked. This is because the thin-film transistors having different reference lines receive different external forces even when the first substrate 110 is bent in a single direction.

In other words, in order to test the influence by bending in different directions, one of the following two methods may be chosen. First, a single thin-film transistor having one reference line may be bent in different directions. Second, thin-film transistors having different reference lines may be bent in a single direction. The second method may reduce stress applied to the display device as compared to the first method, as the display is bent repeatedly, which may break the elements therein. By using thin-film transistors having different reference lines in accordance with one or more embodiments of the present disclosure, the repeated bending of the device may be reduced while accurately evaluating the influence on thin-film transistors due to the bending in different directions.

The first dummy thin-film transistor DT1 may be connected to the first test pad P1, the second test pad P2 and the third test pad P3, and the second dummy thin-film transistor DT2_2 may be connected to the fourth test pad P4, the fifth test pad P5, and the sixth test pad P6, as described above. Similarly, the third dummy thin-film transistor DT3 may be electrically connected to a seventh test pad P7, a eighth test pad P8, and a ninth test pad P9, through a seventh line L7, an eight line L8, and a ninth line L9, respectively. In addition, the fourth dummy thin-film transistor DT4 may be electrically connected to a tenth test pad P10, a eleventh test pad P11, and a twelfth test pad P12, through a tenth line L10, an eleventh line L11, and a twelfth line L12, respectively.

Although they are denoted by different numerals, the third dummy thin-film transistor DT3 and the fourth dummy thin-film transistor DT4 may be connected in substantially the same manner as the first dummy thin-film transistor DT1 is connected to the first test pad P1, the second test pad P2 and the third test pad P3. Therefore, a detailed description thereon will be omitted.

Figure 10:
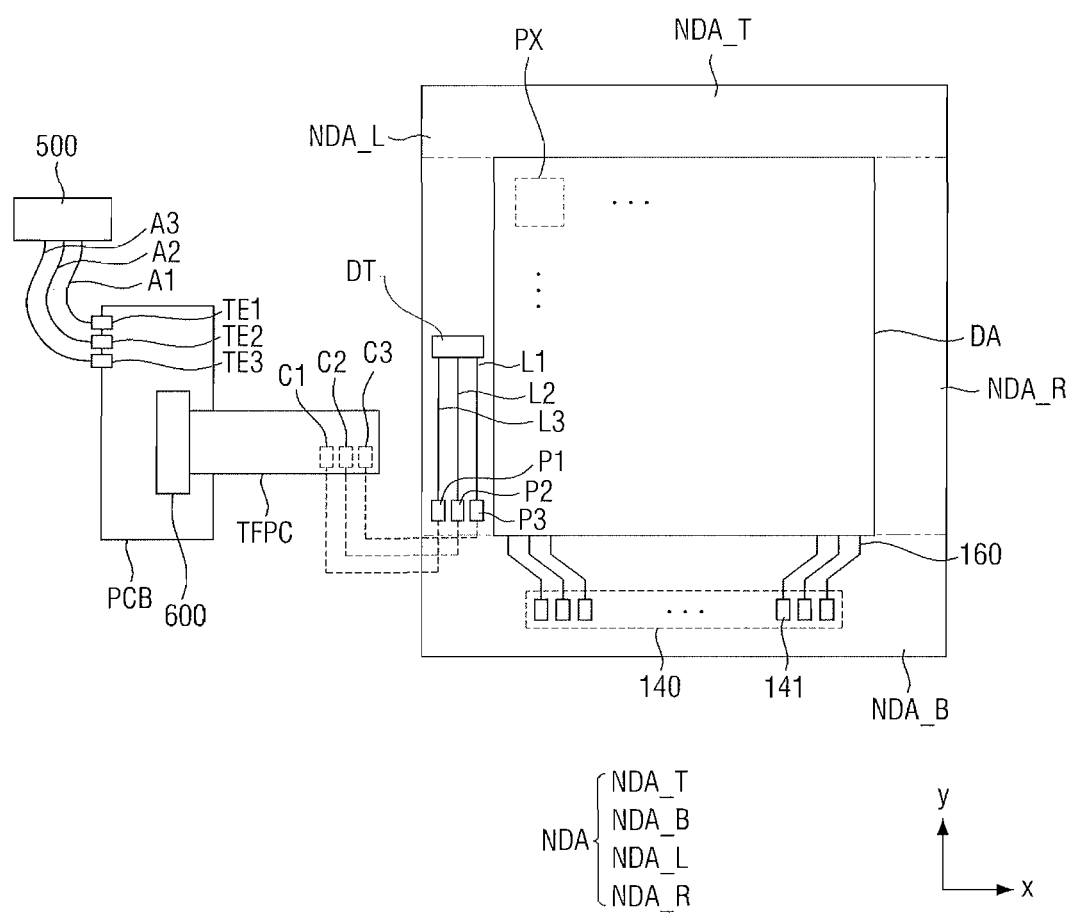
FIG. 10 illustrates a view showing the layout of an apparatus for testing a display device according to an exemplary embodiment of the present disclosure.

Hereinafter, a display device according to another exemplary embodiment of the present disclosure will be described. In the following description, the same or similar elements will be denoted by the same or similar reference numerals, and redundant descriptions will be omitted or briefly described. FIG. 10 is a view showing the layout of an apparatus for testing a display device according to an exemplary embodiment of the present disclosure.

Referring to FIG. 10, an apparatus for testing a display device according to an exemplary embodiment of the present disclosure may include a test circuit film TFPC, a printed circuit board PCB, and a meter 500. In an exemplary embodiment, the apparatus for testing a display device is used to test the display devices according to the above-described exemplary embodiments of the present disclosure. That is to say, the display devices in which at least one dummy thin-film transistor DT is in the non-display area NDA may be tested by using the apparatus for testing according to an exemplary embodiment of the present disclosure.

The test circuit film TFPC may be a flexible printed circuit. A plurality of conductive lines may be formed on the test circuit film TFPC. In an exemplary embodiment, a plurality of connection pads may be on one side of the test circuit film TFPC. The number of connection pads may be equal to the number of test pads on the display device.

In the example shown in FIG. 10, a first connection pad C1, a second connection pad C2, and a third connection pad C3 are electrically connected to the first test pad P1, the second test pad P2, and the third test pad P3, respectively. In an exemplary embodiment, the first connection pad C1, the second connection pad C2, and the third connection pad C3 may be connected to the first test pad P1, the second test pad P2, and the third test pad P3, respectively, by an anisotropic conductive film (ACF). Specifically, the first connection pad C1, the second connection pad C2, and the third connection pad C3 may be electrically connected to the first test pad P1, the second test pad P2 and the third test pad P3, respectively, by conductive particles contained in anisotropic conductive film. Alternatively, the first connection pad C1, the second connection pad C2, and the third connection pad C3 may be directly connected to the first test pad P1, the second test pad P2, and the third test pad P3, respectively.

In an exemplary embodiment, the apparatus according to the exemplary embodiment of the present disclosure may further include a presser for connecting the first connection pad C1, the second connection pad C2, and the third connection pad C3 with the first test pad P1, the second test pad P2, and the third test pad P3, respectively. The presser may press the first connection pad C1, the second connection pad C2 and the third connection pad C3 against the first test pad P1, the second test pad P2, and the third test pad P3, respectively, to thereby electrically connect between them and attach them together.

In an exemplary embodiment, the test circuit film TFPC may be connected to a printed circuit board PCB. In an exemplary embodiment, the test circuit film TFPC may be connected to the printed circuit board PCB by a connector 600. The connector 600 may electrically and mechanically connect the test circuit film TFPC with the printed circuit board PCB.

Test electrodes may be on one side of the printed circuit board PCB. The number of test electrodes may be equal to the number of connection pads or the number of test pads in the display device. FIG. 10 shows a first test electrode TE1, a second test electrode TE2, and a third test electrode TE3. In an exemplary embodiment, the first test electrode TE1, the second test electrode TE2 and the third test electrode TE3 may be connected to the first connection pad C1, the second connection pad C2, and the third connection pad C3, respectively. Specifically, the first test electrode TE1, the second test electrode TE2 and the third test electrode TE3 may be electrically connected to the connection pad C1, the second connection pad C2 and the third connection pad C3, respectively, through the plurality of conductive lines on the printed circuit board PCB and the test circuit film TFPC.

The first test electrode TE1, the second test electrode TE2 and the third test electrode TE3 may be connected to the meter 500 through a first test line A1, a second test line A2 and a third test 1 A3, respectively. In an exemplary embodiment, the meter 500 may measure the characteristics of the dummy thin-film transistor DT. Specifically, the meter 500 may provide signals necessary for the dummy thin-film transistor DT, and may sense the responses to the provided signals to determine whether the dummy thin-film transistor DT is normal.

In an exemplary embodiment, the meter 500 may generate a test gate signal. The generated test gate signal may be transmitted to the dummy gate electrode D_GE of the dummy thin-film transistor DT through the second test electrode TE2, the second connection pad C2 and the second test pad P2. In addition, the response of the dummy source electrode D_SE to the provided test gate signal transmitted to the meter 500 through the first test pad P1, the first connection pad C1, and the first test electrode TE1, may be checked. Similarly, the response of the dummy drain electrode D_DE to the provided test gate signal which is transmitted to the meter 500 through the third test pad P3, the third connection pad C3, and the third test electrode TE3 may be checked.

FIG. 11 is a perspective view of a display device according to an exemplary embodiment of the present disclosure. Referring to FIG. 11, a display device may be bent in an exemplary embodiment.

When an external force is applied to the first substrate 110, the first substrate 110 may be at least partially bent, folded. or rolled. Herein, the portion of the first substrate 110 which is bent, folded or rolled is defined as a bending area BA. That is to say, the bending area BA may be defined as an area on the upper surface of the display device which has a curvature that is not zero.

In an exemplary embodiment, an external force may be applied to the display device to form the bending area BA. In an exemplary embodiment, at least one dummy thin-film transistor DT may overlap the bending area BA along the z-axis direction. In the bending area BA, the elements in display device may receive a stress due to bending, and such stress may have physical or electrical influence on the elements.

As shown in FIG. 11, by connecting an apparatus for testing according to an exemplary embodiment of the present disclosure to the display device while the bending area BA overlaps with the dummy thin-film transistor DT along the z-axis direction, a change in the characteristics of the dummy thin-film transistor DT may be checked in real-time.

Although one dummy thin-film transistor is formed in the example shown in FIGS. 10 and 11 for convenience of illustration, this is merely illustrative. That is to say, the apparatus for testing according to the exemplary embodiment of the present disclosure may test any of the display devices according to the exemplary embodiments described above with reference to FIGS. 1 to 9. When the display device includes n dummy thin-film transistors, the apparatus for testing may include 3n connection pads, 3n test electrodes and 3n test lines accordingly.

Hereinafter, a method for testing a display device according to an exemplary embodiment of the present disclosure will be described in detail. In the following description, the same or similar elements will be denoted by the same or similar reference numerals, and redundant descriptions will be omitted or briefly described. In an exemplary embodiment, the method for testing a display device may be performed by the apparatus for testing according to the above-described exemplary embodiment of the present disclosure.

In an exemplary embodiment, a method for testing a display device includes: preparing the first substrate 110 having a display area DA and a non-display area NDA defined thereon, wherein the non-display area NDA is on an outer side of the display area DA, and wherein the first substrate 110 includes at least one dummy thin-film transistor DT and a plurality of test pads connected to the first dummy thin-film transistor DT; preparing an apparatus for testing a display device, wherein the apparatus includes a test circuit film TFPC having a plurality of connection pads thereon, and a meter 500 connected to the test circuit film TFPC; pressing the test circuit film TFPC and the first substrate 100 such that the connection pads are electrically connected to the test pads; forming a bending area BA on the first substrate 110 such that the bending area BA overlaps the dummy thin-film transistor DT along the z-axis direction; providing a test signal to the first dummy thin-film transistor DT; and checking a response from the dummy thin-film transistor DT to the test signal by using the meter 500.

The first substrate 110 and the apparatus for testing are substantially identical to those described above with respect to the display device or the apparatus for testing according to some exemplary embodiments of the present disclosure. Therefore, the redundant description will be omitted.

The response of the dummy thin-film transistor DT to the test signal may be checked in the same manner as that described above with respect to the apparatus for testing according to some exemplary embodiments of the present disclosure. That is to say, the meter 500 can check whether the dummy thin-film transistor DT is properly activated by checking the response from the dummy source electrode D_SE and the dummy drain electrode D_DE to the provided test gate signal.

In addition, by applying an external force to change the bending area BA while the test circuit film TFPC and the first substrate 110 are pressed, the influence by bending on the dummy thin-film transistor DT may be checked in real-time. As used herein, the changing the bending area BA may mean changing the shape of the bending area BA by changing the direction of the applied external force.

One or more embodiments provide a display device capable of checking influence by bending, e.g., bending in different directions, on a thin-film transistor. One or more embodiments also provide an apparatus and method for testing a display device by which influence by bending on a thin-film transistor can be checked in real-time.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a first substrate having a display area and a non-display area defined thereon, the non-display area being on an outer side of the display area;
   a plurality of test pads in the non-display area; and
   a first dummy thin-film transistor in the non-display area and electrically connected to the test pads,
   wherein the first dummy thin-film transistor includes:
   a dummy gate electrode; and
   a dummy source electrode and a dummy drain electrode, insulated from the dummy gate electrode and spaced apart from each other,
   wherein a bending area is defined on the first substrate that at least partially traverses the display area and the non-display area, the bending area overlaps the first dummy thin-film transistor.

2. The display device as claimed in claim 1, further comprising a second dummy thin-film transistor adjacent to the first dummy thin-film transistor.

3. The display device as claimed in claim 2, wherein:
   a first reference line passing through the dummy source electrode and the dummy drain electrode is defined in the first dummy thin-film transistor,
   a second reference line is defined in the second dummy thin-film transistor, and
   the first reference line and the second reference line extend in different directions.

4. The display device as claimed in claim 3, wherein the first reference line is perpendicular to the second reference line.

5. The display device as claimed in claim 3, wherein the plurality of test pads includes:
   a first test pad, a second test pad, and a third test pad connected to the first dummy thin-film transistor, and
   a fourth test pad, a fifth test pad, and a sixth test pad connected to the second dummy thin-film transistor.

6. The display device as claimed in claim 5, wherein:
   the first dummy thin-film transistor and the second dummy thin-film transistor are between the first through third test pads and the fourth through sixth test pads,
   the first test pad, the second test pad, and the third test pad are arranged in parallel, and
   the fourth test pad, the fifth test pad and the sixth test pad are arranged in parallel.

7. The display device as claimed in claim 3, further comprising:
   a third dummy thin-film transistor defining a third reference line; and
   a fourth dummy thin-film transistor defining a fourth reference line,
   wherein the first reference line, the second reference line, the third reference line and the fourth reference line extend in different directions.

8. The display device as claimed in claim 1, further comprising:
   a flexible printed circuit board connected to the non-display area of the first substrate,
   wherein the first dummy thin-film transistor overlaps the flexible printed circuit board.

9. The display device as claimed in claim 1, further comprising a dummy semiconductor pattern layer that overlaps the dummy gate electrode, the dummy drain electrode, and the dummy source electrode.

10. The display device as claimed in claim 1, further comprising:
a plurality of pixels in the display area,
wherein each of the pixels includes at least one switching element, and
wherein the at least one-switching element has a shape substantially the same as a shape of the first dummy thin-film transistor.

11. An apparatus for testing a display device, the apparatus comprising:
a test circuit film connected to a first substrate having a display area and a non-display area defined thereon, wherein the non-display area is on an outer side of the display area, and the first substrate includes a first dummy thin-film transistor in the non-display area and a plurality of test pads connected to the first dummy thin-film transistor;
connection pads on a side of the test circuit film and electrically connected to the test pads, respectively; and
a meter connected to the test circuit film, wherein
a bending area is defined that at least partially traverses the display area and the non-display area,
the first dummy thin-film transistor overlaps the bending area, and
the meter checks influence on the first dummy thin-film transistor when the bending area is bent.

12. The apparatus as claimed in claim 11, wherein the meter provides the first dummy thin-film transistor with a test signal through the connection pads and the test pads, and then checks a response from the first dummy thin-film transistor.

13. The apparatus as claimed in claim 11, wherein the meter checks in real-time the influence on the first dummy thin-film transistor by the bending area.

14. The apparatus as claimed in claim 11, wherein the first substrate further includes a second dummy thin-film transistor adjacent to the first dummy thin-film transistor.

15. The apparatus as claimed in claim 14, wherein:
a first reference line is defined in the first dummy thin-film transistor,
a second reference line is defined in the second dummy thin-film transistor, and
the first reference line and the second reference line extend in different directions.

16. A method for testing a display device, the method comprising:
preparing a first substrate having a display area and a non-display area defined thereon, wherein the non-display area is on an outer side of the display area, and the first substrate includes a first dummy thin-film transistor and a plurality of test pads connected to the first dummy thin-film transistor;
preparing an apparatus for testing a display device, wherein the apparatus includes a test circuit film having a plurality of connection pads thereon and a meter connected to the test circuit film;
pressing the test circuit film and the first substrate such that the connection pads are electrically connected to the test pads;
forming a bending area on the first substrate such that the bending area overlaps the first dummy thin-film transistor;
providing a test signal to the first dummy thin-film transistor; and
checking a response from the first dummy thin-film transistor to the test signal using the meter.

17. The method as claimed in claim 16, wherein forming the bending area includes applying force to the bending area.

18. The method as claimed in claim 17, wherein checking the response includes checking influence on the first dummy thin-film transistor by the force in real-time using the meter.

19. The method as claimed in claim 16, wherein the first substrate further includes a second dummy thin-film transistor adjacent to the first dummy thin-film transistor.

20. The method as claimed in claim 19, wherein:
a first reference line is defined in the first dummy thin-film transistor,
a second reference line is defined in the second dummy thin-film transistor, and
the first reference line and the second reference line extend in different directions.

* * * * *